(12) United States Patent
Betscher et al.

(10) Patent No.: US 10,840,207 B2
(45) Date of Patent: Nov. 17, 2020

(54) LINE-INTEGRATED SWITCH AND METHOD FOR PRODUCING A LINE-INTEGRATED SWITCH

(71) Applicant: Auto-Kabel Management GmbH, Hausen i.W. (DE)

(72) Inventors: Simon Betscher, Grevenbroich (DE); Wacim Tazarine, Erkelenz (DE)

(73) Assignee: Auto-Kabel Management GmbH, Hausen i.W. (DE)

( * ) Notice: Subject to any disclaimer, the term of this patent is extended or adjusted under 35 U.S.C. 154(b) by 74 days.

(21) Appl. No.: 16/308,157

(22) PCT Filed: Mar. 22, 2017

(86) PCT No.: PCT/EP2017/056761
§ 371 (c)(1),
(2) Date: Dec. 7, 2018

(87) PCT Pub. No.: WO2017/215798
PCT Pub. Date: Dec. 21, 2017

(65) Prior Publication Data
US 2019/0172811 A1    Jun. 6, 2019

(30) Foreign Application Priority Data

Jun. 14, 2016 (DE) .................. 10 2016 110 847

(51) Int. Cl.
*H01L 23/00* (2006.01)
*H01L 21/66* (2006.01)

(52) U.S. Cl.
CPC .............. *H01L 24/33* (2013.01); *H01L 24/06* (2013.01); *H01L 24/29* (2013.01); *H01L 24/32* (2013.01);
(Continued)

(58) Field of Classification Search
CPC ......... H01L 24/33; H01L 24/06; H01L 24/29; H01L 24/32; H01L 24/83; H01L 24/92;
(Continued)

(56) References Cited

U.S. PATENT DOCUMENTS 4,737,602 A * 4/1988 Yamamoto ............. H01H 15/06
                                                200/16 D
6,014,066 A * 1/2000 Harberts .................. H01P 1/15
                                                257/735

(Continued)

FOREIGN PATENT DOCUMENTS

DE        22 35 455 A1    5/1973
DE        694 27 629 T2  11/1993
(Continued)

OTHER PUBLICATIONS

Intellectual Property Office of Mexico, Office Action, Application No. MX/a/2018/015715, dated Feb. 6, 2020, 4 pages.
(Continued)

*Primary Examiner* — Timothy J Thompson
*Assistant Examiner* — Michael F McAllister
(74) *Attorney, Agent, or Firm* — Sunstein LLP

(57) ABSTRACT

Line-integrated switch having at least a first metal flat part 2, at least a second metal flat part 8, wherein the flat parts are arranged in an overlapping region with the wide sides thereof one above the other and in the overlapping region a semi-conductor switch 18 is arranged between the flat parts 2, 8 so as to connect the flat parts 2, 8 to each other in a switching manner. A simple construction is possible in that at least in the overlapping region a first of the flat parts 2, at a side facing the second of the flat parts 8, is coated at least partially with an insulation, wherein a recess is provided in
(Continued)

the insulation in a contact region 10 and the semi-conductor switch 18 in the contact region 10 is electrically contacted with the flat part 8.

19 Claims, 6 Drawing Sheets

(52) U.S. Cl.
CPC .............. *H01L 24/83* (2013.01); *H01L 24/92* (2013.01); *H01L 22/14* (2013.01); *H01L 2224/04026* (2013.01); *H01L 2224/06102* (2013.01); *H01L 2224/291* (2013.01); *H01L 2224/32227* (2013.01); *H01L 2224/32245* (2013.01); *H01L 2224/3303* (2013.01); *H01L 2224/33181* (2013.01); *H01L 2224/83411* (2013.01); *H01L 2224/83447* (2013.01); *H01L 2224/83801* (2013.01); *H01L 2224/92* (2013.01)

(58) Field of Classification Search
CPC .......... H01L 22/14; H01L 2224/04026; H01L 2224/06102; H01L 2224/291; H01L 2224/32227; H01L 2224/32245; H01L 2224/3303; H01L 2224/33181; H01L 2224/83411; H01L 2224/83447; H01L 2224/83801; H01L 2224/92
USPC ...................................................... 174/84 R
See application file for complete search history.

(56) References Cited

U.S. PATENT DOCUMENTS

| | | | | |
|---|---|---|---|---|
| 6,423,902 | B1* | 7/2002 | Babiel | ................. H01R 13/665 |
| | | | | 174/84 R |
| 7,952,166 | B2* | 5/2011 | Hirler | ................. H01L 29/7397 |
| | | | | 257/591 |
| 2004/0112732 | A1* | 6/2004 | Bergstedt | ............ H01H 50/005 |
| | | | | 200/511 |
| 2009/0302444 | A1 | 12/2009 | Ueda et al. | |
| 2010/0238627 | A1 | 9/2010 | Shinohara | |
| 2010/0296254 | A1 | 11/2010 | Schnetker et al. | |
| 2011/0205765 | A1* | 8/2011 | Saito | ...................... H01F 17/06 |
| | | | | 363/21.15 |
| 2013/0016548 | A1 | 1/2013 | Seki | |
| 2014/0117495 | A1* | 5/2014 | Li | ......................... H01L 23/642 |
| | | | | 257/531 |
| 2014/0233204 | A1 | 8/2014 | Tokuyama et al. | |
| 2016/0181361 | A1* | 6/2016 | Shea | .................. H01L 29/4175 |
| | | | | 257/341 |
| 2017/0048971 | A1 | 2/2017 | Ullermann et al. | |
| 2017/0170139 | A1 | 6/2017 | Schmidt et al. | |
| 2019/0172811 | A1* | 6/2019 | Betscher | ................. H01L 24/32 |

FOREIGN PATENT DOCUMENTS

| | | | |
|---|---|---|---|
| DE | 10 2008 054306 | A1 | 12/2009 |
| DE | 10 2009 040444 | A1 | 10/2010 |
| DE | 10 2012 202281 | A1 | 8/2013 |
| DE | 10 2014 006 346 | A1 | 11/2015 |
| EP | 0 450 223 | A1 | 10/1991 |
| EP | 2 573 809 | A1 | 3/2013 |
| EP | 2 775 516 | A2 | 9/2014 |
| JP | 2004-140068 | A | 5/2004 |
| JP | 2013-065620 | A | 4/2013 |
| JP | 2013 073945 | | 4/2013 |
| JP | 2013073945 | * | 4/2013 |
| WO | WO 99/46832 | A1 | 9/1999 |
| WO | WO 02/078088 | A1 | 10/2002 |
| WO | WO 2013/038749 | A1 | 3/2013 |
| WO | WO 2015/121367 | A1 | 8/2015 |

OTHER PUBLICATIONS

Wikipedia, "Dilatation Thermique," [online] [retrieved on Jun. 8, 2016]. Retrieved from the Internet: https://fr.wikipedia.org/w/index.php?title=Dilatationthermique&oldid=126879890, 5 pages.
Wikipedia, "Dilatation Thermique," [online] [retrieved on Jun. 8, 2016]. Retrieved from the Internet: https://fr.wikipedia.org/w/index.php?title=Dilatationthermique&oldid=126879890, 12 pages [English Translation].
Authorized Officer: Maslankiewicz, Pawel, Mitteilung über Die übermittlung Des Internationaalen Recherchenberichts Und Des Schriftlichen Bescheids Der Internationalen Recherchenbehorder Oder Der Erklarung [International Search Report] PCT/EP2017/056761, 28 pages, Oct. 4, 2017.
Authorized Officer: Maslankiewicz, Pawel, International Search Report, PCT/EP2017/056761, Oct. 4, 2017, 5 pages [English Translation].

* cited by examiner

90°

90°

LINE-INTEGRATED SWITCH AND METHOD FOR PRODUCING A LINE-INTEGRATED SWITCH

The subject-matter relates to a line-integrated switch and a method for producing a line-integrated switch.

In the automotive field of use, flat parts, in particular flat conductors, are increasingly being used. In particular, the battery positive line is increasingly formed by a so-called backbone cable. Such a cable often has a flat conductor and extends along the longitudinal axis of a vehicle. There may be electrical branches over the extent of the cable. These branches are currently connected permanently to the flat conductor. Switching such branches is not currently possible but is often desirable.

For this reason, the object of the present invention was to provide a line-integrated switch which is small and which can be used in particular in automotive applications.

This object is achieved objectively by a line-integrated switch according to claim 1 and a method according to claim 14.

The objective line-integrated switch will preferably be used in automotive applications, in particular in connection with a battery line. A first and a second flat part are objectively proposed. The two flat parts can be formed, for example, as connection members for flat conductors or other electrical conductors. It is also possible for at least one of the flat parts to be formed as a flat conductor. Such a flat conductor can be formed, for example, in particular from a solid material and can act as a battery line, in particular as an energy line, inside a motor vehicle. The line cross-section of flat parts is generally configured to permanently carry currents of more than 10 amperes.

It is objectively proposed that the flat parts have an overlapping region. The flat parts are located one above the other in this overlapping region. In particular, the flat parts are located with the wide sides thereof one above the other.

In order to switch the connection between the two flat conductors, it is proposed that in the overlapping region a semi-conductor switch be arranged between the flat parts so as to connect the flat parts to each other in a switching manner. Such a semi-conductor switch may be a MOSFET, IGBT or the like. The semi-conductor switch may be formed as a transistor, thyristor, triac or the like. A semi-conductor switch is distinguished in that it can switch a connection between two line contacts, for example, drain and source, via a switch contact. The voltage between the switch contact and one of the line contacts, for example, source, can be relevant in determining whether the connection between the line contacts is electrically conductive or not.

By using the line-integrated switch in an electrical system, for example, it is possible to switch as required from a central location comprising extremely different outputs from a first flat conductor to at least a second flat conductor. This may be particularly advantageous for the battery and energy management within the motor vehicle. For technical safety reasons, switching where necessary from individual branches of a main energy line may also be advantageous.

According to one embodiment, the longitudinal axes of the flat parts can intersect with each other in the overlapping region. In this case, the longitudinal axes can be located, for example, in an angular manner, in particular at a right angle, relative to each other. That is to say that a second flat part can branch off from a first flat part which is formed as a battery line in an angular manner, preferably at right-angles. This allows a very flexible distribution structure within an electrical system to be produced.

In order to make the connection between the two flat parts switchable, it is proposed that at least in the overlapping region a first of the flat parts at a side facing the second of the flat parts be coated at least partially with an insulation, wherein a recess is provided in the insulation in a contact region and the semi-conductor switch in the contact region is electrically contacted with the flat part. The insulation prevents a direct connection between the flat parts relative to each other. The semi-conductor switch is connected to the first flat part in the contact region and can, for example, be connected to the second flat part with a second connection. It is thereby possible to electrically arrange the semi-conductor switch between the two flat parts and the electrical connection can switch between these two parts.

A semi-conductor switch can be made of metal, in particular coated with metal, in the region of an upper side of the housing thereof and/or in the region of a lower side of the housing thereof at least in the region of a contact. It is particularly possible also to provide two contacts, in particular a switch contact and a line contact, on the semi-conductor switch on a lower side, preferably in a plane-parallel manner relative to each other. The second line contact can be provided on the upper side of the semi-conductor switch. In this case, the semi-conductor switch can be arranged between the two flat parts in a sandwich-like manner.

Nowadays, semi-conductor switches are generally constructed in such a manner that the faces of both the switch contact and the two line contacts are located to the greatest possible extent in a plane in the region of a first surface. It may be necessary for the objective application for one of the two line contacts to be guided electrically on a second surface of the semi-conductor switch which is opposite the first surface. This can be achieved in that the second line contact in the form of an electrical coating of the semi-conductor switch is formed as a cooling member. This cooling member can be used objectively to be electrically connected to a flat part in order consequently to produce the sandwich-like structure between the two flat parts and the semi-conductor switch.

For a good electrical connection between the flat part and the semi-conductor switch, the semi-conductor switch is soldered in the contact region to the first flat part. In this case, it is advantageous for the contact region to be tin-plated.

According to one embodiment, it is proposed that the first flat part be coated with an at least three-layered structure, wherein a conductive layer is guided between two insulation layers.

In this three-piece structure, the respective layers can be connected to each other in an adhesive and/or bonding manner. In this case, it is particularly advantageous if a first layer which is applied directly to the flat part is formed from a printed circuit board material. The printed circuit board material may in particular be a so-called prepreg (preimpregnated fibres). This material is generally the carrier material for strip conductors. The printed circuit board material can be applied directly to the flat part in an adhesive manner.

According to one embodiment, it is proposed that on the printed circuit board material a conductive layer is applied. The conductive layer is preferably a copper layer. In this case, the conductive layer is preferably processed in such a manner that it forms strip conductors. This can be carried out in particular by a conventional production method for printed circuit boards by an exposure and etching of the copper layer being carried out so that strip conductors can be formed from the copper layer.

Subsequently, the strip conductors or the conductive layer can be provided with a protective layer, in particular a solder resist, as proposed according to one embodiment.

The protective layer can be constructed in such a manner that in particular contact pads and solder pads for discrete parts are free from the protective paint and release the material of the conductive layer. A discrete part can then be soldered thereto. It is particularly advantageous if a contact pad for a switch contact of the semi-conductor switch is formed on the conductive layer.

The contact region can be coated in such a manner that it substantially terminates in the plane which is formed by the conductive layer and/or the protective layer. In this case, the contact region can be coated with metal so that the metal coating is always spaced apart from the conductive layer. It is particularly possible to configure the contact region so as to be circumferentially spaced apart from the three-layered structure by means of selective coating. This prevents a short-circuit between the contact region and the conductive layer from impairing the function of the semi-conductor switch or the line-integrated switch.

According to one embodiment, the semi-conductor switch with a conductor contact, in particular a source or drain contact, is connected to the contact region, and at the same time with the switch contact thereof, in particular the gate contact thereof, to a contact pad on the conductive layer. Other, preferably non-conductive portions of the housing of the semi-conductor switch can be positioned on the protective layer.

There can particularly be used a semi-conductor switch in which both line contacts (in particular source, drain) and the switch contact (in particular gate) are arranged in one plane. If such a semi-conductor switch is placed on the first flat part, a conductor contact is directly connected to the contact region and the switch contact is directly connected to the contact pad on the conductive layer. These direct connections are produced by soldering.

The second conductor contact which is located in the plane of the first conductor contact is deposited on the insulation layer according to one embodiment. The insulation layer and/or the conductive layer or the strip conductor of the conductive layer can be configured in such a manner that, in the region in which this second conductor contact is positioned on the insulation layer, no contact with the strip conductor or the flat part is possible. Consequently, this conductor contact is insulated at the support face thereof with respect to the flat part.

A semi-conductor switch can, for cooling purposes, switch the second conductor contact via a housing portion to the surface thereof opposite the first conductor contact. This surface is opposite the surface on which the first conductor contact and the switch contact are. This surface can be used to bring the semi-conductor switch into contact with the second conductor contact thereof with the second flat part, in particular the connection region thereof, as will be described below.

However, it is also possible that a semi-conductor switch has directly the two conductor contacts thereof on mutually opposing surfaces and the support of the second conductor contact, as described above, is unnecessary.

According to one embodiment, it is proposed that the second flat part at least in the overlapping region is coated with metal. This metal coating may be a tin coating. The metal coating may form a connection region. In particular, this connection region is on the surface of the second flat part which is facing the first flat part in the connected state. Consequently, the contact region and the connection region are located at mutually facing sides of the first and second flat part.

The semi-conductor switch is electrically contacted with the second flat part in the connection region. In particular, one of the conductor contacts of the semi-conductor switch is electrically contacted in the connection region. This electrical contacting can be carried out in particular by soldering. Consequently, the semi-conductor switch forms a connection between the two flat parts which can be switched via the switch contact. The electrical connection between the two flat parts can now be switched on and off by means of suitable control of the switch contact via the strip conductors of the conductive layer.

Advantageously, a plurality of semi-conductor switches is arranged in a parallel manner between two flat parts in the manner described so that the current carrying capacity thereof is sufficient to carry the entire current which flows between the two flat parts. The power loss in each individual semi-conductor switch also becomes smaller so that the heat losses produced in each semi-conductor switch can be adequately discharged. This is particularly advantageous if the flat parts are used in the field of energy lines, particularly in the field of a battery line.

The flat parts can also be used in flat cables, for example, B+ or B− cables. Cables may also be two-strand or multi-strand, wherein each strand can be formed by a flat part. At mutually opposing sides of the cable, one of the flat parts can be connected to a third flat part in the manner described via a semi-conductor switch. Consequently, outputs from both strands, in particular a positive line and a negative line, can very easily be configured.

According to one embodiment, it is proposed that at least in the overlapping region the second flat part be coated at the side facing the first flat part with an insulator, in particular an insulation paint. The second flat part is also preferably coated in an insulating manner so that contacting of the second flat part with the first flat part or with discrete structural elements which are soldered on the strip conductor of the conductive layer is prevented.

The flat parts are preferably formed from an aluminium material. In particular, E aluminium, for example, aluminium 99.5, may be used. The aluminium is preferably soft-annealed so that a good plastic deformability is provided. It is also possible for at least one of the flat parts to be formed from a copper material. Depending on the field of application, one flat part can also be formed from a copper material and one flat part can be formed from an aluminium material.

In particular, the connection region on the second flat part but also the contact region can be provided on the flat part by means of roll-bonding. It is thus possible for a contact pad to be rolled on the flat part by means of roll-bonding.

Preferably, the longitudinal axes of the flat parts are in the region of the overlapping region parallel or equiaxial relative to each other. This is advantageous when a switch element is intended to be provided in the extent of a flat conductor, in particular in the longitudinal extent of a flat conductor. The flat conductor can then be formed by the first and second flat parts which are connected to each other so as to be able to be switched relative to each other by the semi-conductor switch.

In this context, it is also mentioned that it may be advantageous if the flat parts are formed as connection elements, for example, as crimp connectors, connector flaps, connectors with bolts, connectors with holes or the like. It may be advantageous if, for example, at one end of a flat conductor, the semi-conductor switch is connected to a flat part which is formed as a connection element. In this case, the longitudinal axes of the flat conductor which forms the first flat part and of the connection element which forms the second flat part may also be parallel with each other.

In particular, the line contacts of the semi-conductor switch are connected, on the one hand, to the contact region and, on the other hand, to the connection region. This means that a first line contact, for example the source, is connected to the contact region or the connection region and the corresponding second line contact, for example the drain, is connected either to the contact region or the connection region, respectively. It is then possible to produce a conductive connection between the two line contacts by activation via the switch contact and consequently also a conductive connection between the contact region and the connection region, consequently between the two flat parts.

Another aspect is a method for producing a line-integrated switch, in particular a line-integrated switch described above. It has been recognised that the contact region and the connection region have thermal capacities which are different from each other. Particularly as a result of the construction of the connection region, the thermal capacity thereof may be higher than that of the contact region. In this case, it may be advantageous, and it is proposed that initially a first connection of a semi-conductor switch be connected to the connection region. In this case, in particular soldering is suitable.

When the connection region is connected to the first connection of the semi-conductor switch, it is advantageous if a first energy input which is sufficient to solder the connection region to the first connection be carried out.

Subsequently, a contact region of a second flat part can be connected to a second connection of a semi-conductor switch. In particular, a soldering operation can also be carried out here. In this case, it may be advantageous for this connection to be brought about with a second energy input which is smaller than the first energy input.

In particular, the contact region may have a smaller thermal capacity than the connection region. This may be particularly for the reason that on the flat part with the contact region the insulation layer and the conductive layer which are thermally insulating to a specific degree are applied. In this case, it may be sufficient to introduce a smaller heat energy into the contact region in order to allow soldering.

In order to keep the waste in the production method as low as possible, it may be advantageous to electrically test the electrical connection between the semi-conductor switch and the connection region before the connection to the contact region. This may be carried out, for example, by a conductor contact and a switch contact of the semi-conductor switch being acted on with test connections, whereas a second conductor contact is already connected to the connection region. A connection between the first conductor contact and the second conductor contact can be tested by a conductive connection being produced between the conductor contacts via the switch contact and consequently a conductive transition between the second conductor contact and the flat part being present.

The subject-matter is explained in greater detail below with reference to drawings which show embodiments and in which:

FIG. 1b is a section through a flat part according to FIG. 1a;

FIG. 2b is a section through the second flat part according to FIG. 2a;

Figure 1A:
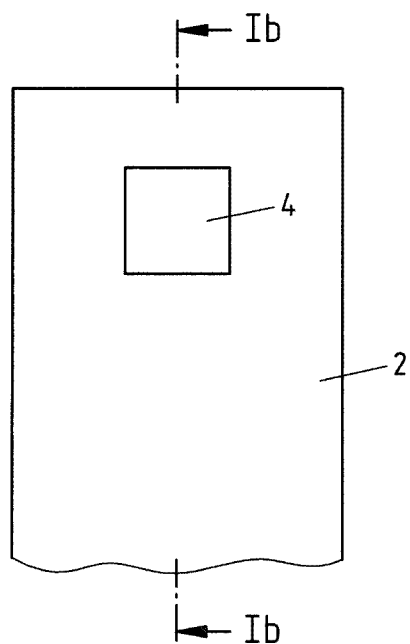
FIG. 1a is a plan view of a first flat part with a connection region according to one embodiment.

FIG. 1 is a plan view of a first flat part 2. The first flat part 2 may, for example, be produced from a copper material or an aluminium material. A connection region 4 may be provided in a central region of the flat part 2. The connection region 4 may, for example, be a metal coating on the flat part 2. In particular, the connection region 4 may have been applied to the flat part 2 by means of roll-bonding as a metal coating. When an aluminium material is used for the flat part 2, the connection region 4, for example, a copper element or a tin element, may be roll-bonded on the flat part 2.

Figure 1B:
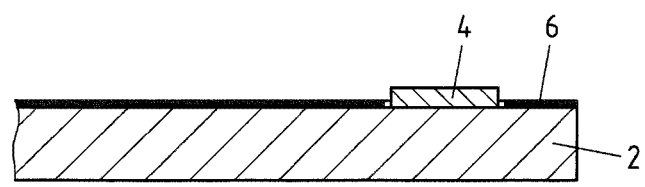

FIG. 1b is a section Ib through the flat part 2. It shows that the flat part 2 is formed from a solid material. It can further be seen that the flat part 2 has a substantially greater material thickness than the metal coating of the connection region 4. In particular, the material thickness of the flat part 2 is at least ten times the material thickness of the connection region 4. An insulation layer 6 can be applied to the flat part 2. The material thickness of the insulation layer 6 can also be a tenth or less of the material thickness of the flat part 2. It can also be seen that the connection region 4 is free from the insulation layer 6.

The flat part 2 can have a length between two and ten centimetres in the longitudinal extent thereof and, for example, be formed as a connection element or have as a flat conductor a length of from several tens of centimetres up to over a metre. This is particularly advantageous when the flat part 2 is used as an energy backbone in an electrical system.

Figure 2A:
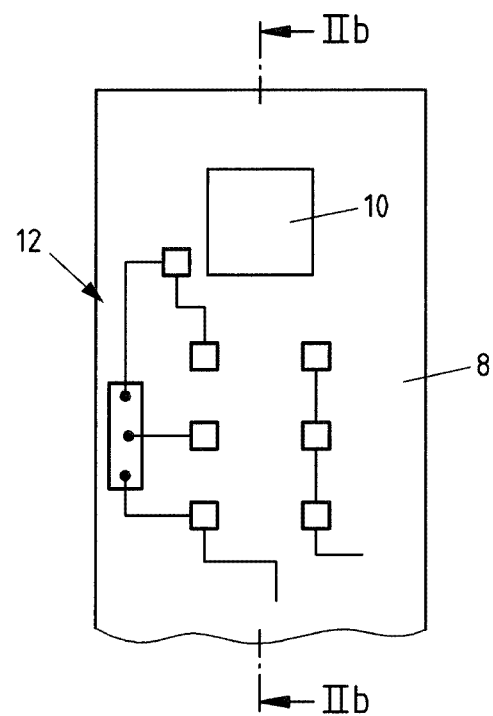
FIG. 2a is a plan view of a second connection region with a contact region.

The explanations in relation to the material, the structure and the extent with respect to the flat part 2 also apply accordingly to the flat part 8 which is shown in FIG. 2a.

FIG. 2a shows a second flat part 8 as a plan view. The second flat part 8 has a contact region 10. The contact region 10 is applied directly to the material of the flat part 8. The contact region 10 may particularly be a metal coating already described above.

A strip conductor or strip conductors in the form of a printed circuit (Printed Circuit Board, PCB) can be applied to a printed circuit board layer 12 on the flat part 8 with a conductive layer 14. In this case, discrete electrical and electronic structural elements can be arranged on the printed circuit.

Figure 2B:
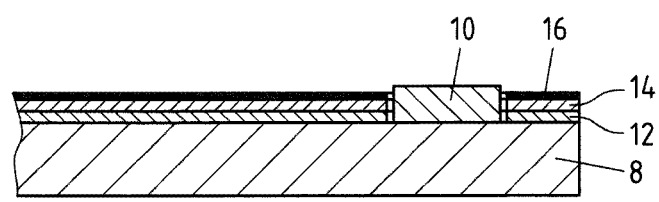

FIG. 2b is the section through the flat part 8 according to FIG. 2a. It can be seen that initially a printed circuit board layer 12 is applied to the material of the flat part 8.

The printed circuit board layer 12 can be adhesively bonded to the flat part 10 or be applied non-releasably in another manner. A conductive layer 14 can be applied above the printed circuit board layer 12. The conductive layer 14 is preferably a copper layer. The printed circuit which is shown in FIG. 2a can be constructed with the conductive layer 14.

To this end, conventional methods for producing PCBs can be used. An insulation layer 16 is provided over the conductive layer 14.

FIG. 2b shows that the contact region 10 has a gap with spacing from at least the conductive layer 14 on the flat part 8. The height of the contact region 10 can be selected in such a manner that it preferably terminates in the same plane as the insulation layer 16 or the conductive layer 12.

Particularly if the contact region 10 and the conductive layer 14 are plane-parallel with respect to each other, a semi-conductor 18 can be positioned on the flat part 8 and can be electrically connected with a conductor contact to the contact region 10 and with a switch contact to the printed circuit board layer 12 without mechanical loads being placed on the semi-conductor switch 18.

The printed circuit board layer 12 is configured in such a manner that, in the region of the boundary between the printed circuit board layer 12 and the contact region 10, there is provided a contact pad, on which a switch contact of the semi-conductor switch can be positioned and can be electrically contacted. Consequently, the switch contact of the semi-conductor switch can be controlled via the circuit of the printed circuit board layer 12 and the conductive connection can be produced between the two conductor contacts of the semi-conductor switch.

The insulation layer 16 and the conductive layer 14 have in particular a material thickness which is at least one tenth of the material thickness of the flat part 8 and/or the printed circuit board layer 12.

Figure 3:
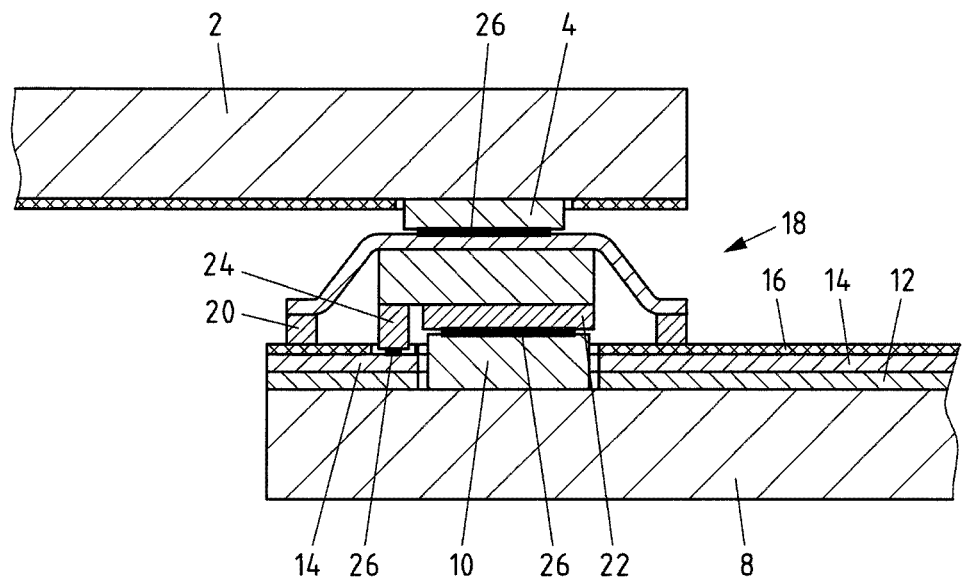
FIG. 3 is a section through a line-integrated switch element with the flat parts according to FIGS. 1a and 2a and a semi-conductor switch according to one embodiment.

FIG. 3 is a sectional view of the flat parts 2 and 8 in accordance with FIGS. 2b and 1b. A semi-conductor switch 18 is arranged between the flat parts 2 and 8. The semi-conductor switch 18 has, in a manner representative of conductor contacts of semi-conductor switches, a source contact 20 and a drain contact 22. Furthermore, the semi-conductor switch 18 has, in a manner representative of a switch contact of semi-conductor switches, a gate contact 24. It can be seen that the source contact 20, drain contact 22 and gate contact 24 are substantially located in a plane relative to each other.

One of the conductor contacts, in this case the drain contact 22, and the switch contact, in this case the gate contact 24, are connected within a plane in an electrically conductive manner to the contact region 10 or the conductive layer 14, respectively. This can be seen by means of solder contact locations 26.

The gate contact 24 is connected in an electrically conductive manner to a contact pad on the conductive layer 14 via a solder contact location 26. Approximately in the same plane, the drain contact 22 is connected in an electrically conductive manner to the contact region 10 via a solder contact location 26. In this case, the drain contact 22 is preferably such that it is located in the connected state directly above the contact region 10. A connection between the drain contact 22 and the conductive layer 14 is preferably prevented by a circumferential gap between the contact region 10 and the conductive layer 14.

A source contact 20 can be provided on the opposite side of the drain contact 22. In the illustration, which is, however, merely exemplary, this can be brought about in that the source contact 20 is guided out of the plane with the drain contact 22 and the gate contact 24 via a housing cover of the cast semi-conductor material of the semi-conductor switch 18 at the opposite side of the semi-conductor switch 18.

Semi-conductor switches may be provided with such cooling elements as housing elements and thus allow contacting of one of the conductor contacts via the cooling element.

In such an arrangement, the source contacts 20 which are in the plane with the drain contact 22 and the gate contact 24, are positioned on the insulation layer 16. This leads to a stabilisation of the semi-conductor switch 18 between the flat parts 2 and 8.

The source contact 22 is connected in an electrically conductive manner to the connection region 4 via a solder contact location 26.

During the production, initially the connection between the connection region 4 and the source contact 20 is preferably produced. In this case, the semi-conductor switch 18 is brought with the source contact 20 located on the connection region 4 into a soldering oven and the solder contact location 26 is produced there between the connection region 4 and the source contact 20. Subsequently, this connection can be electrically tested by a conductive connection between the source contact 20 and the drain contact 22 being produced by the gate contact 24 being activated and testing being carried out as to whether the drain contact 22 is connected to the flat part 2 in an electrically conductive manner.

Subsequently, if the testing was successful, the flat part 8 can be positioned with the contact region 10 thereof on the drain contact 22 and can be brought into connection with the contact pad for the gate contact 24.

Subsequently, a repeated soldering of the solder contact locations 26 between the gate contact 24 and the conductive layer 14 and the contact region 10 and drain contact 22 is carried out. In this case, in particular a lower heating energy can be introduced for soldering, which protects the semi-conductor switch 18 and which may be sufficient in the arrangement shown as a result of the lower thermal capacity of the flat part 8.

Figure 4:
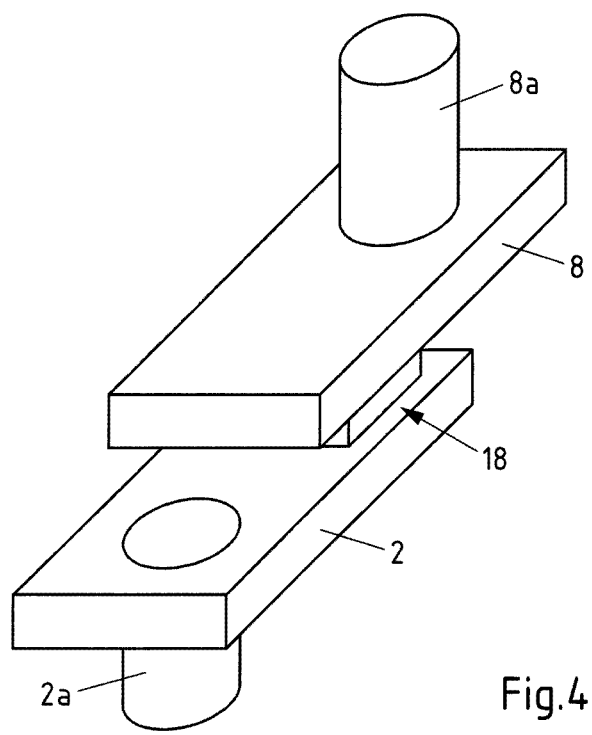
FIG. 4 is a view of a line-integrated switch with two connections according to one embodiment.

FIG. 4 shows two flat parts 2, 8 which are formed as connection elements. A flat part 2 may have, for example, a hole 2a which is suitable for receiving a bolt. A contact part 8 may have, for example, a bolt 8a which is, for example, welded on. A semi-conductor switch 18 may be provided between the contact parts 2 and 8. Consequently, the conductive connection between the flat parts 2 and 8 can be switched via the semi-conductor switch 18.

Figure 5:
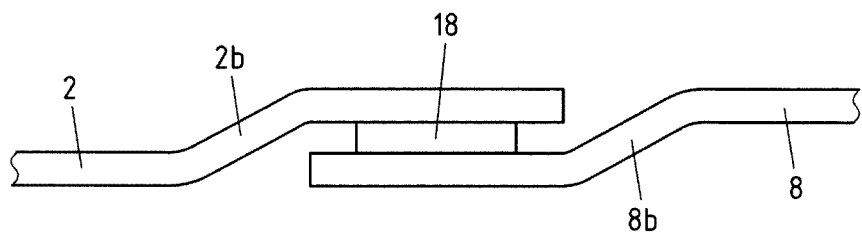
FIG. 5 is a section through a line-integrated switch according to one embodiment.

FIG. 5 is a section through two flat parts 2, 8 with a semi-conductor switch 18. The flat parts 2, 8 can both be, or only one, as a flat conductor with an extent of several tens of centimetres up to a metre. Another of the flat parts 2, 8 may be, for example, a connection element or a flat conductor. As can be seen, a vertical offset 2b, 8b is provided in the flat parts 2, 8 in a region directly in front of the semi-conductor switch 18, for example, five to ten centimetres before the end of the respective flat part 2, 8. The vertical offset may be at least half of the height of the semi-conductor switch 18. A vertical offset 2b, 8b may also be provided in only one of the flat parts 2, 8. As a result of the vertical offset, it is possible for the plane in which the flat conductors 2, 8 extend to be an identical plane and for an offset in the conduction plane to have to be provided only in the region of the semi-conductor switch 18. This results in a smaller spatial requirement of the line-integrated switch.

Figure 6:
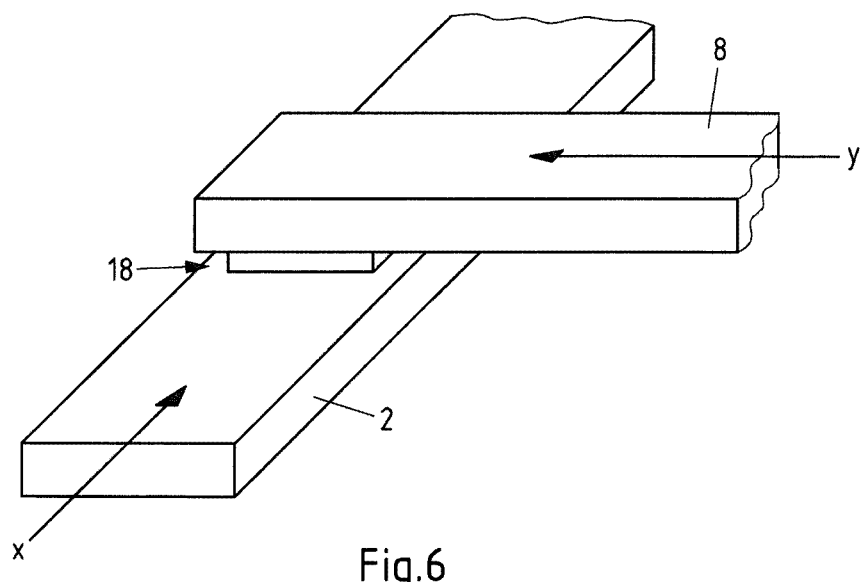
FIG. 6 is a view of a connection of two flat parts with a line-integrated switch according to one embodiment.

FIG. 6 shows another embodiment. A first flat part 2 can be formed, for example, as a flat conductor. The flat conductor 2 may be insulated and may be free of the insulation only in the region of the connection with respect to the second flat part 8. The second flat part 8 can be connected to the first flat part 2 in an electrically switchable manner via a semi-conductor switch 18.

The longitudinal extent direction of the flat part 2 in the x direction may be at an angle relative to the longitudinal extent direction of the flat part 8 in the y direction. In particular, the longitudinal axes x, y can be at right-angles relative to each other. This arrangement allows an output of a flat part 8 along a flat part 2 which is formed as a flat conductor to possible consumers. This is particularly advantageous in automotive applications.

Figure 7:
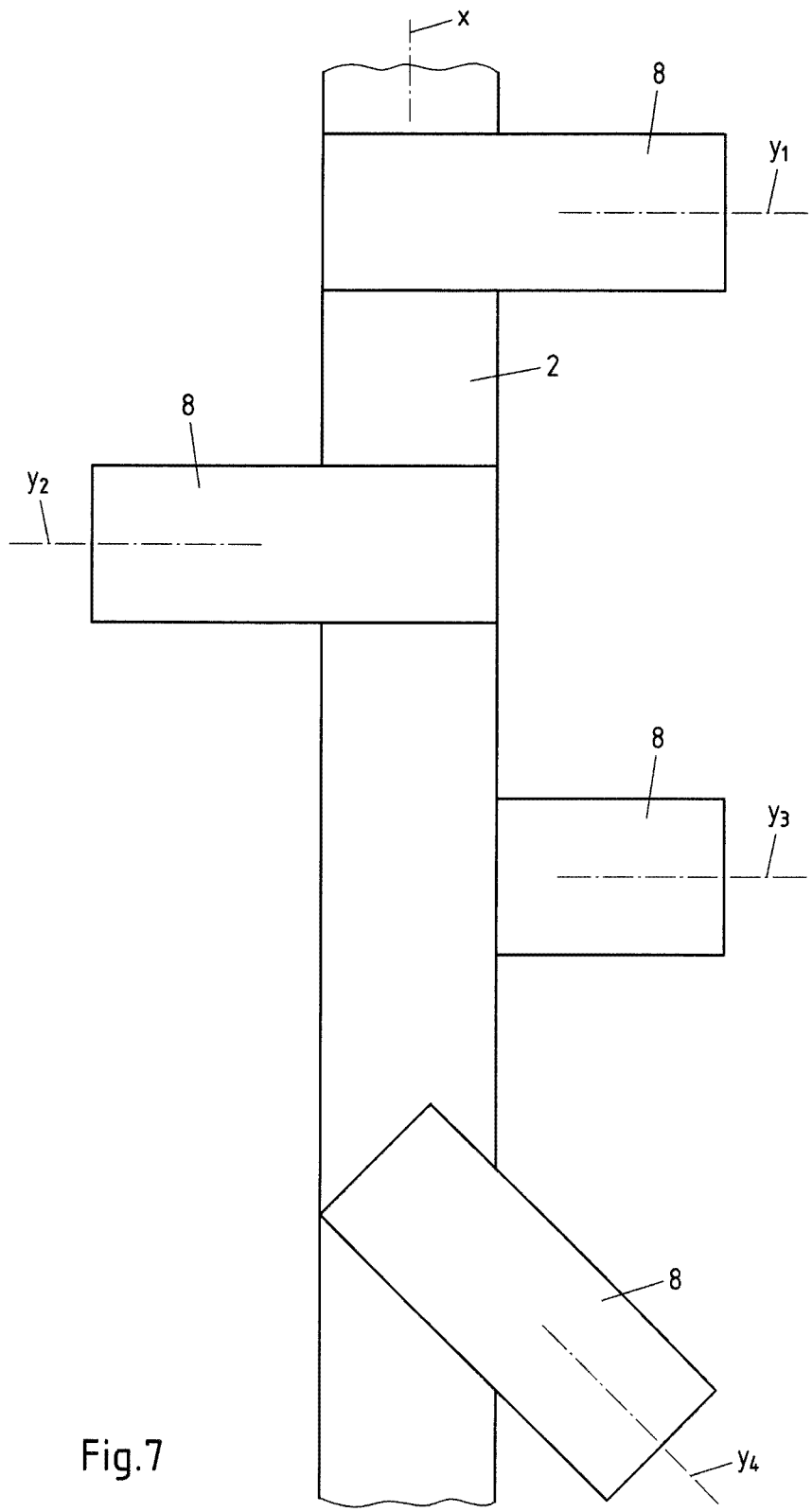
FIG. 7 is a plan view of a flat conductor with different outputs with a line-integrated switch according to one embodiment.

FIG. 7 shows another embodiment in which the flat part 2 is formed as a flat conductor. The longitudinal extent direction of the flat part 2 is depicted along the x axis. Flat parts 8 can branch off transversely thereto at different locations of the flat part 2 in different longitudinal extent directions along different axes y1, y2, y3, y4. It can be seen, for example, that a flat part 8 which extends along the axis y3 is arranged on a surface of the flat part 2 opposite another flat part 8.

It can also be seen that the axis y4 extends at an angle relative to the x axis. The illustration in FIG. 7 is intended to make it clear that extremely different output directions and different output positions of a flat conductor 2 are possible by means of the line-integrated switch.

Figure 8:
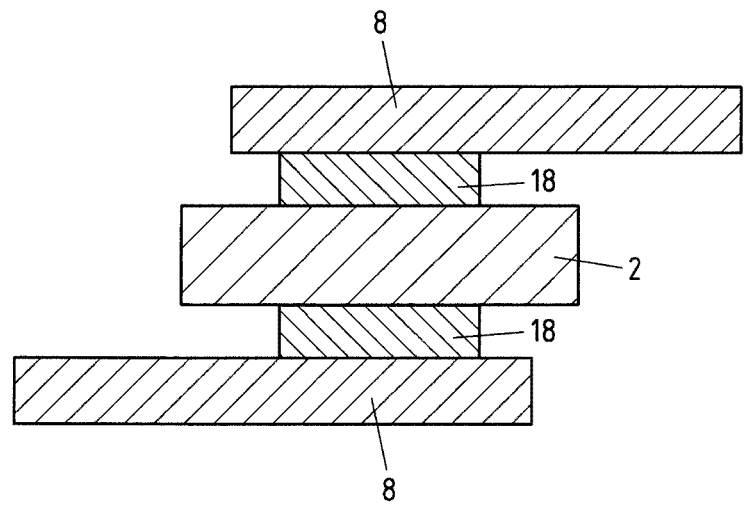
FIG. 8 is a section though a flat line with line-integrated switches arranged opposite each other according to one embodiment.

FIG. 8 shows the possibility of providing an output at a surface of a flat part 2. It can be seen that a first semi-conductor switch 18 connects at a first surface the flat part 2 to a flat part 8 and a second semi-conductor switch 18 connects at a surface opposite this surface the flat part 2 to a flat part 8. Outputs at both sides of the flat part 2 are thereby possible.

Figure 9:
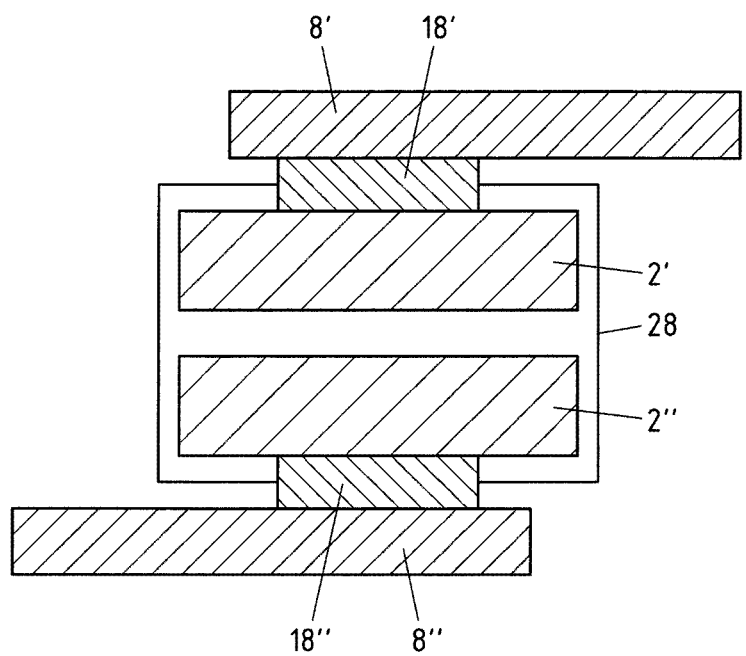
FIG. 9 is a section through a double conductor each with a line-integrated switch each one of the conductors according to one embodiment.

FIG. 9 shows another embodiment in which two flat parts 2', 2" are each guided as flat conductors in a common insulation 28 and form a two-strand flat cable. The flat parts 2', 2" can be connected at different vehicle power supply potentials within a vehicle electrical system. It is also possible for one of the flat conductors 2' to be used as a B+ conductor and another of the flat conductors 2" to be used as an earth return line.

In the region of a line-integrated switch, the insulation 28 may be removed. Each of the flat parts 2', 2" can be connected to a semi-conductor switch 18', 18" and consequently can have an output to a flat part 8', 8". Consequently, it is possible to branch extremely different power supply potentials, in particular in an electrical system, separately from each other to different consumers or parts in a switchable manner.

LIST OF REFERENCE NUMERALS

2 Flat part
4 Connection region
6 Insulation layer
8 Flat part
10 Contact region
12 Printed circuit board layer
14 Conductive layer
16 Insulation layer
18 Semi-conductor switch
20 Source contact
22 Drain contact
24 Gate contact
26 Solder contact location
28 Insulation

The invention claimed is:

1. Multi-layer cable with a line-integrated switch comprising:
at least a first strand made from a metal flat part,
at least a second strand made from a metal flat part,
wherein the stands are guided in a common isolation,
wherein each strand a respective flat part are arranged in respective overlapping region with the wide sides thereof one above the other and in the overlapping region a semi-conductor switch is arranged between the respective strand and the respective flat part so as to connect the strands with the flat part to each other in a switching manner,
wherein at least in the overlapping region a respective strand at a side facing the second of the respective flat part is coated at least partially with an insulation, wherein a recess is provided in the insulation in a contact region and the semiconductor switch is electrically contacted with the respective strand in the contact region,
wherein the longitudinal axes of the respective strand and the respective flat part are formed in the region of the overlapping region in an angular manner.

2. Line-integrated switch according to claim 1,
wherein the respective semiconductor switch is soldered in the contact region to the respective strand and/or in that the contact region is tin-plated.

3. Line-integrated switch according to claim 1, wherein the first respective flat part is coated with an at least three-layered structure, wherein a conductive layer is guided between two insulation layers.

4. Line-integrated switch according to claim 3,
wherein the insulation layer is formed from at least one printed circuit board material and the printed circuit board material is applied directly to the respective flat part.

5. Line-integrated switch according to claim 4,
wherein on the printed circuit board material the conductive layer is applied, in particular in that the conductive layer is a copper layer, wherein the conductive layer forms in particular strip conductors.

6. Line-integrated switch according to claim 5,
wherein a protective layer, in particular a solder resist is applied to the conductive layer.

7. Line-integrated switch according to claim 5,
wherein the conductive layer has a contact pad for a gate contact of the semiconductor switch.

8. Line-integrated switch according to claim 1,
wherein at least in the overlapping region the respective flat part is coated at a side facing the respective strand at least partially with a metal coating, so as to form a connection region, wherein the semiconductor switch is soldered to the respective flat part in the connection region.

9. Line-integrated switch according to claim 1,
wherein at least in the overlapping region the respective flat part is coated at the side facing the respective strand with an insulator, in particular with an insulation paint.

10. Line-integrated switch according to claim 1,
wherein at one of the respective strands or the respective flat parts is formed from an aluminium material or a copper material.

11. Line-integrated switch according to claim 1,
wherein on the respective flat part at least one metal coating is roll-bonded on the flat part.

12. Line-integrated switch according to claim 8, wherein the semiconductor switch is connected with the source and drain contacts thereof to the contact region and the connection region.

13. Multi-layer cable with a line-integrated switch comprising:
at least a first strand made from a metal flat part,
at least a second strand made from a metal flat part,
wherein the stands are guided in a common isolation,
wherein each strand a respective flat part are arranged in respective overlapping region with the wide sides thereof one above the other and in the overlapping region a semiconductor switch is arranged between the respective strand and the respective flat part so as to connect the strands with the flat part to each other in a switching manner,
wherein at least in the overlapping region a respective strand at a side facing the second of the respective flat part is coated at least partially with an insulation, wherein a recess is provided in the insulation in a contact region and the semiconductor switch is electrically contacted with the respective strand in the contact region,
wherein the first respective flat part is coated with an at least three-layered structure, wherein a conductive layer is guided between two insulation layers,
wherein the insulation layers include at least one printed circuit board material and the printed circuit board material is applied directly to the respective flat part,
wherein on the printed circuit board material the conductive layer is applied,
wherein a solder resist is applied as a protective layer to the conductive layer.

14. Line-integrated switch according to claim 13, wherein the respective semiconductor switch is soldered in the contact region to the respective strand and/or in that the contact region is tin-plated.

15. Line-integrated switch according to claim 13, wherein the conductive layer has a contact pad for a gate contact of the semiconductor switch.

16. Line-integrated switch according to claim 13, wherein at least in the overlapping region the respective flat part is coated at a side facing the respective strand at least partially with a metal coating, so as to form a connection region, wherein the semiconductor switch is soldered to the respective flat part in the connection region.

17. Line-integrated switch according to claim 13, wherein on the respective flat part at least one metal coating is roll-bonded on the flat part.

18. Line-integrated switch according to claim 13, wherein the longitudinal axes of the respective strand and the respective flat part are formed in the region of the overlapping region in an angular manner.

19. Line-integrated switch according to claim 16, wherein the semiconductor switch is connected with the source and drain contacts thereof to the contact region and the connection region.

\* \* \* \* \*